(12) United States Patent  (10) Patent No.: US 9,417,309 B1
Fan et al.  (45) Date of Patent: Aug. 16, 2016

(54) TEST STRUCTURE AND METHOD FOR CALIBRATING THREE-DIMENSIONAL THERMOGRAPHY FAULT ISOLATION TOOL

(71) Applicant: Xilinx, Inc., San Jose, CA (US)

(72) Inventors: Yuezhen Fan, Los Gatos, CA (US); Daisy Lu, Fremont, CA (US)

(73) Assignee: XILINX, INC., San Jose, CA (US)

( * ) Notice: Subject to any disclaimer, the term of this patent is extended or adjusted under 35 U.S.C. 154(b) by 323 days.

(21) Appl. No.: 14/092,588

(22) Filed: Nov. 27, 2013

(51) Int. Cl.
*G01J 5/02* (2006.01)
*G01R 35/00* (2006.01)

(52) U.S. Cl.
CPC .................................. *G01R 35/005* (2013.01)

(58) Field of Classification Search
CPC ................. H01L 2924/00; H01L 2924/00014; G01R 31/025
USPC ................... 324/512, 527, 532, 535
See application file for complete search history.

(56) References Cited

U.S. PATENT DOCUMENTS

| | | | | |
|---|---|---|---|---|
| 5,795,068 A * | 8/1998 | Conn, Jr. | ................ | G01K 7/245 374/141 |
| 6,483,326 B1 * | 11/2002 | Bruce | ................ | G01R 31/2851 257/E21.525 |
| 6,879,172 B1 * | 4/2005 | Eppes | ................ | G01R 31/2877 324/750.03 |
| 2011/0297829 A1 * | 12/2011 | Altmann | ................ | G01N 1/00 250/332 |

\* cited by examiner

*Primary Examiner* — Arleen M Vazquez
*Assistant Examiner* — Robert P Alejnikov, Jr.
(74) *Attorney, Agent, or Firm* — Gerald Chan

(57) ABSTRACT

An apparatus for calibrating a three-dimensional thermography fault isolation tool, includes: a substrate having two or more pins; a first semiconductor die coupled to the substrate; a first heat generating test component at the first semiconductor die; and a second heat generating test component, wherein the first heat generating test component and the second heat generating test component are located at different respective heights; wherein the first heat generating test component is configured to produce a first temperature change in response to a voltage applied by the three-dimensional thermography fault isolation tool to the two or more pins; and wherein the second heat generating test component is configured to produce a second temperature change in response to the voltage or another voltage applied by the three-dimensional thermography fault isolation tool.

21 Claims, 10 Drawing Sheets

TEST STRUCTURE AND METHOD FOR CALIBRATING THREE-DIMENSIONAL THERMOGRAPHY FAULT ISOLATION TOOL

FIELD

An embodiment described herein relates generally to three-dimensional thermography fault isolation tools, and in particular to a test structure and method for calibrating a three-dimensional thermography fault isolation tool.

BACKGROUND

Three-dimensional integrated circuit (IC) device packages may include multiple semiconductor dies connected through an interposer die, which is then mounted on a package substrate. The semiconductor dies of the 3-D IC device may be located on the same plane or may be stacked on top of each other. Various configurations for 3-D IC devices may be realized, depending on the package type and functionality of the 3-D IC device.

In order to detect faulty components of the 3-D IC device, including the semiconductor dies and interposers, a technique known as thermography may be utilized. Thermography involves applying a voltage to the 3-D IC device and monitoring the thermal behavior of the device's components (e.g., semiconductor dies, interposer die). When a component of the semiconductor device includes faults, the temperature of that component will exhibit a temperature change in response to the applied voltage. The temperature change may be captured an infrared (IR) camera positioned facing the 3-D IC device, and the image used to determine the location of the fault in the X-Y plane.

With 3-D IC devices, simply locating the fault in the X-Y plane is not sufficient to isolate the location of the fault. For example, where multiple semiconductor dies and the interposer die are stacked on top of each other, the fault may be located in any of the semiconductor dies or the interposer die. Thus, it becomes necessary with 3-D IC devices to isolate the location of the fault by identifying a component (e.g., semiconductor dies or interposer die) of the 3-D IC device to which the fault belongs.

Conventional three-dimensional thermography fault isolation tools identify the component of the 3-D IC device to which the fault belongs by theoretically modeling the thermal behavior of the 3-D IC device. The theoretical thermal behavior model uses the various materials, thicknesses, and other parameters that make up the individual layers of components of the 3-D IC devices to model the time it takes for temperature of a component in the 3-D IC device to change in response to voltage being applied to the 3-D IC device. Whenever a fault is isolated in the X-Y direction by applying voltage to the 3-D IC device and capturing the temperature change with an IR camera, a time difference between the application of the voltage and the thermal change in the 3-D IC device is also determined. This time difference may then be compared against the theoretical thermal behavior model for the 3-D IC device to identify the component of the 3-D IC device to which the fault belongs.

While in theory using a theoretical thermal behavior model for a 3-D IC device should allow for accurate identification of the component of the 3-D IC device to which the fault belongs, in practice identification of the fault location using the theoretical thermal behavior model is often inaccurate. Although a theoretical thermal behavior model may be associated with a particular 3-D IC device type, each individual 3-D IC device of that type may exhibit thermal behavior that differs significantly from the theoretical model. This is due to the variability in material parameters during manufacturing of 3-D IC devices. For example, the thicknesses of layers making up components of an actual 3-D IC device may vary from the thicknesses of layers used to generate the theoretical model. Similarly, material parameters of solder bumps/balls forming connections between 3-D IC device components may also vary from the material parameters used to generate the theoretical model, leading to thermal behavior of the actual 3-D IC device that differs from the theoretical thermal behavior model.

Likewise because of the close proximity between components of the 3-D IC device, it is easy for a three-dimensional thermography fault isolation tool that utilizes a theoretical thermal behavior model to misidentify the component at which a fault is located based on time differences. Variability in 3-D IC device parameters from those of the theoretical model may cause enough of a change in time difference associated with temperature change for a faulty component, such that the thermal behavior model misidentifies the component at which the fault is located.

Because of such inaccuracies, conventional three-dimensional thermography fault isolation tools cannot be relied upon to isolate the location of the fault in a 3-D IC device.

SUMMARY

An apparatus for calibrating a three-dimensional thermography fault isolation tool, includes: a substrate having two or more pins; a first semiconductor die coupled to the substrate; a first heat generating test component at the first semiconductor die; and a second heat generating test component, wherein the first heat generating test component and the second heat generating test component are located at different respective heights; wherein the first heat generating test component is configured to produce a first temperature change in response to a voltage applied by the three-dimensional thermography fault isolation tool to the two or more pins; wherein the second heat generating test component is configured to produce a second temperature change in response to the voltage or another voltage applied by the three-dimensional thermography fault isolation tool; and wherein a first time difference exists between the application of the voltage and an occurrence of the temperature change in the first heat generating test component, and a second time difference exists between the application of the voltage or the other voltage and an occurrence of the temperature change in the second heat generating test component.

Optionally, the first time difference is different from the second time difference.

Optionally, the first heat generating test component and the second heat generating test component are coupled in series.

Optionally, the two or more pins comprise a first two pins and a second two pins, and wherein a first voltage applied to the first two pins of the substrate causes the first temperature change in the first heat generating test component, and a second voltage applied to the second two pins of the substrate causes the second temperature change in the second heat generating test component.

Optionally, the different respective heights for the first heat generating test component and the second heat generating test component are measured along a Z-axis, and the first and second heat generating test components are in different locations with respect to an X-Y plane that is perpendicular to the Z-axis.

Optionally, the apparatus further includes a second semiconductor die stacked above the first semiconductor die, wherein the second heat generating test component is at the second semiconductor die.

Optionally, the apparatus further includes an interposer die configured to couple the first semiconductor die to the substrate, wherein the second heat generating test component is at the interposer die.

Optionally, the apparatus further includes a third heat generating test component, wherein the first, second, and third heat generating test components are located at different respective heights.

Optionally, the first heat generating test component comprises a resistor.

Optionally, the first heat generating test component comprises a diode.

Optionally, the substrate and the first semiconductor die are parts of a test structure that is different from an integrated circuit device to be tested by the three-dimensional thermography fault isolation tool.

Optionally, the substrate and the first semiconductor die are parts of an integrated circuit device to be tested by the three-dimensional thermography fault isolation tool.

A method involving a three-dimensional thermography fault isolation tool, includes: providing an apparatus comprising a substrate having two or more pins, a first semiconductor die coupled to the substrate, a first heat generating test component, and a second heat generating test component, wherein the first heat generating test component and the second heat generating test component are located at different respective heights; applying one or more voltages, using the three-dimensional thermography fault isolation tool, to the two or more pins of the substrate to cause a first temperature change in the first heat generating test component, and a second temperature change in the second heat generating test component; determining a first time difference between the application of the one or more voltages and an occurrence of the first temperature change in the first heat generating test component; and determining a second time difference between the application of the one or more voltages and an occurrence of the second temperature change in the second heat generating test component.

Optionally, the first and second heat generating test components comprise first and second diodes.

Optionally, the first and second diodes are dummy diodes.

Optionally, the apparatus comprises a semiconductor device, and the first diode and the second diode are functional diodes in the semiconductor device.

Optionally, the method further includes storing the first time difference and the second time difference in a non-transitory medium.

Optionally, the first heat generating test component and the second heat generating test component are coupled in series, and the act of applying one or more voltages comprises applying one voltage.

Optionally, the apparatus further comprises a second semiconductor die stacked above the first semiconductor die, and wherein the second heat generating test component is at the second semiconductor die.

Optionally, the apparatus is different from an integrated circuit device to be tested by the three-dimensional thermography fault isolation tool, and wherein the method further comprises: testing the integrated circuit device to produce a temperature change at a component in the integrated circuit device; determining a time difference between the application of the voltage and the corresponding temperature change at the component in the integrated circuit device; and comparing the time difference with at least one of the first time difference and the second time difference to determine a position of the component.

Optionally, the apparatus is an integrated circuit device, and wherein the method further comprises: testing the integrated circuit device to produce a temperature change at a component in the integrated circuit device; determining a time difference between the application of the voltage and the corresponding temperature change at the component in the integrated circuit device; and comparing the time difference with at least one of the first time difference and the second time difference to determine a position of the component.

Other features will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIGS. 2-1 and 2-2 are a cross-sectional schematic diagram and top-view schematic diagram illustrating application of a three-dimensional thermography fault isolation tool to a 3-D IC device.

FIGS. 3-1 and 3-2 are a cross-sectional schematic diagram and top-view schematic diagram illustrating application of a three-dimensional thermography fault isolation tool to an alternative 3-D IC device.

FIG. 4-1 is a cross-sectional schematic diagram of a test structure for calibrating a three-dimensional thermography fault isolation tool.

FIG. 4-2 is a cross-sectional schematic diagram of another test structure for calibrating a three-dimensional thermography fault isolation tool.

FIG. 5-1 is a cross-sectional schematic diagram of another test structure for calibrating a three-dimensional thermography fault isolation tool.

FIG. 5-2 is a cross-sectional schematic diagram of another test structure for calibrating a three-dimensional thermography fault isolation tool.

FIG. 5-3 is a cross-sectional schematic diagram of another test structure for calibrating a three-dimensional thermography fault isolation tool.

FIG. 5-4 is a cross-sectional schematic diagram of another test structure for calibrating a three-dimensional thermography fault isolation tool.

FIGS. 7-1 and 7-2 are cross-sectional schematic diagrams illustrating three-dimensional thermography fault isolation tools being calibrated using an integrated circuit device.

FIG. 8-1 is a cross-sectional schematic diagram illustrating a three-dimensional thermography fault isolation tool being calibrated using an integrated circuit device.

FIG. 8-2 is another cross-sectional schematic diagram illustrating a three-dimensional thermography fault isolation tool being calibrated using an integrated circuit device.

FIG. 8-3 is another cross-sectional schematic diagram illustrating a three-dimensional thermography fault isolation tool being calibrated using an integrated circuit device.

FIG. 8-4 is another cross-sectional schematic diagram illustrating a three-dimensional thermography fault isolation tool being calibrated using an integrated circuit device.

DETAILED DESCRIPTION

Figure 1:
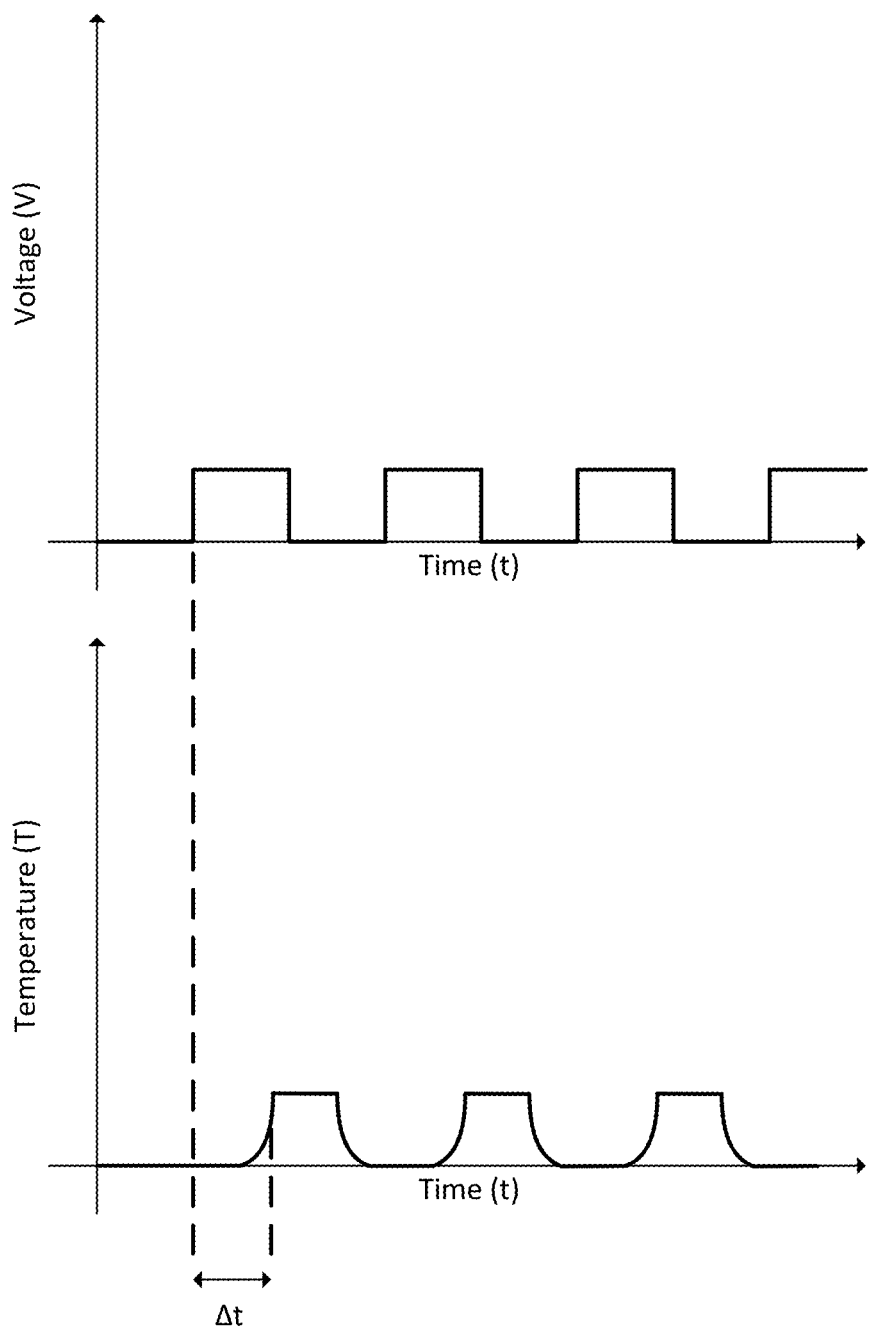
FIG. 1 illustrates a voltage vs. time graph and temperature vs. time graph for identifying fault location in a 3-D IC device.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

An embodiment described herein provides a test structure and a method for calibrating three-dimensional thermography fault isolation tools. The test structure includes a substrate having two or more pins, an interposer having a first resistor and a first semiconductor die having a second resistor. A voltage applied to the two or more pins causes a first heat generating test component and a second heat generating test component in the test structure to produce respective temperature changes. A first time difference between application of the voltage and an occurrence of the temperature change in the first heat generating test component, and a second time difference between application of the voltage and an occurrence of the temperature change in the second heat generating test component are determined and provided for the three-dimensional thermography fault isolation tool to thereby calibrate the three-dimensional thermography fault isolation tool. Because the test structure is manufactured in the same manner as 3-D IC devices to be tested by the three-dimensional thermography fault isolation tool, the test structure will include device parameter variability similar to that of the 3-D IC devices to be tested, thereby allowing fault isolation to be performed more accurately than a theoretical thermal behavior model. The actual time differences calculated for subsequently tested 3-D IC devices may be compared against the time differences identified using the heat generating test components to locate which component of the subsequently tested 3-D IC the fault belongs to. This ensures a much more reliable three-dimensional thermography fault isolation tool that is based on an actual test structure that resembles 3-D IC devices to be subsequently tested rather than a theoretical thermal behavior model.

In another embodiment, instead of using a test structure that resembles the 3-D IC device to be tested, the 3-D IC device itself may be used to calibrate the three-dimensional thermography fault isolation tool. Because the three-dimensional thermography fault isolation tool is calibrated using the actual 3-D IC device to be tested rather than a theoretical thermal behavior model, the three-dimensional thermography fault isolation tool will take into account device parameter variability of the 3-D IC device. The ability of the three-dimensional fault isolation tool to identify the location of the fault and its corresponding 3-D IC device component will thus be made to be much more accurate. Furthermore, allowing the three-dimensional thermography fault isolation tool to be calibrated using the 3-D IC device to be tested requires minimal cost and processing.

FIG. 1 illustrates a voltage vs. time graph and temperature vs. time graph for identifying fault location in a 3-D IC device.

The voltage vs. time graph illustrates an example of voltage application to a 3-D IC device. For example, voltage may be applied to package pins of the 3-D IC device in periodic intervals, such as illustrated in FIG. 1. Alternative voltage application configurations may also be used. The voltage applied to the package pins of the 3-D IC device traverses the components of the 3-D IC device, and the thermal behavior of those components are monitored to identify faults.

The temperature vs. time graph illustrates the thermal behavior of a faulty component (e.g., semiconductor die or interposer die) in the 3-D IC device in response to the applied voltage. Faulty components of a 3-D IC die will exhibit a temperature change in response to applied voltage.

The location of the fault in the X-Y plane can be determined by simply using an IR camera that is positioned facing the top of the 3-D IC device. The IR camera identifies the location of the fault in the X-Y plane by capturing a temperature change of the 3-D IC device (e.g., hot spot) in the X-Y plane.

The measured time difference ($\Delta t$) between the application of the voltage to the 3-D IC and the occurrence of the temperature change in the faulty component of the 3-D IC device may then be used to determine the component of the 3-D IC device to which the fault belongs. The measured time difference is compared against a theoretical thermal behavior model of the 3-D IC device to determine which component is exhibiting the fault. As mentioned above, the theoretical thermal behavior model uses the various materials, thicknesses, and other parameters that make up the individual layers of components of the 3-D IC devices to model the time it takes for temperature of a component in the 3-D IC device to change in response to voltage being applied to the 3-D IC device. Based on the comparison between the measured time difference and the timing characteristics of the theoretical thermal behavior model, the component to which the fault belongs is determined.

However, because of the variability in manufacturing processes and close proximity between components for 3-D IC devices, a theoretical thermal behavior model is often inaccurate when used to determine the component of the 3-D IC device to which the fault belongs.

Figures 1, 2:
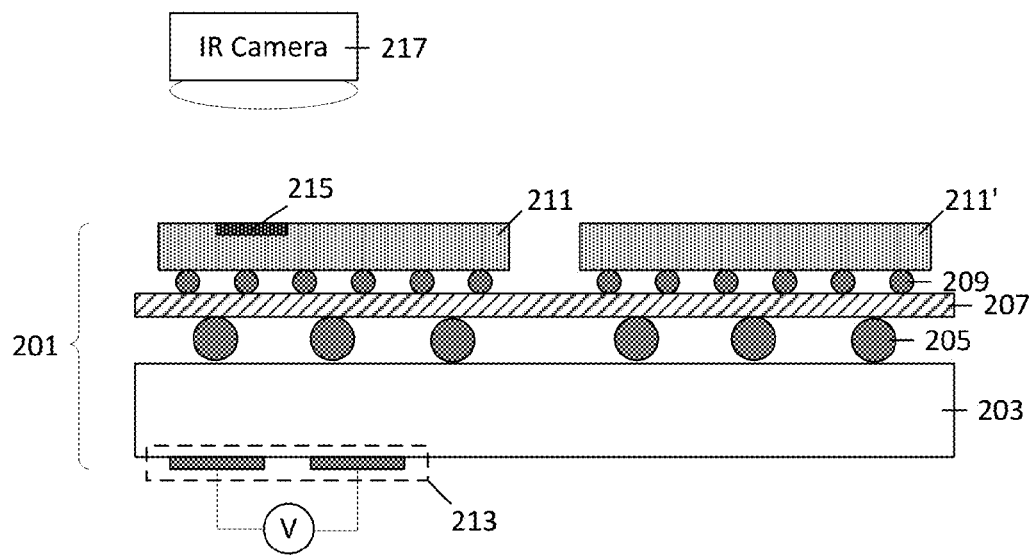
Figure 2:
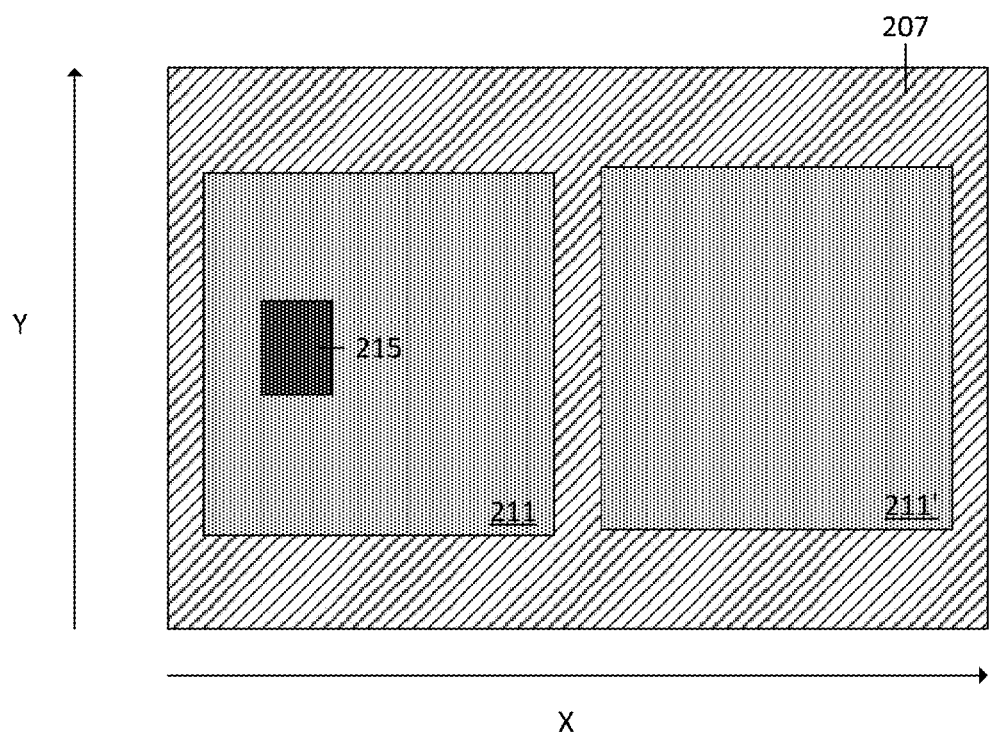

FIGS. 2-1 and 2-2 are a cross-sectional schematic diagram and top-view schematic diagram illustrating application of a three-dimensional thermography fault isolation tool to a 3-D IC device.

A three-dimensional thermography fault isolation tool that includes a voltage source V and an infrared (IR) camera 217 is used to identify fault location of a 3-D IC device 201.

The 3-D IC device includes a package substrate 203 with a set of package pins 213, an interposer die 207 and semiconductor dies 211, 211'. The semiconductor dies 211, 211' may be coupled to the interposer die 207 using a plurality of solder bumps 209. The interposer die 207 includes routing functionality that allows the semiconductor dies 211, 211' to communicate with each other. The interposer die 207 may be coupled to the package substrate 203 through a plurality of solder balls 205. The package substrate contains routing functionality for allowing external sources to communicate with the interposer die 207 and the semiconductor dies 211, 211' of the 3-D IC device 201. External communication with the interposer die 207 and the semiconductor dies 211, 211' of the 3-D IC device 201 may be made through the package pins 213 of the package substrate 203.

The voltage source V and the infrared camera 217 may be coupled with a computer system with software for locating faults within the 3-D IC device 201. The infrared camera may capture a temperature change (e.g., hot spot) 215 of a faulty component of the 3-D IC device in the X-Y plane in response to voltage applied by the voltage source V. The software tool may determine the time difference between application of the voltage and occurrence of the temperature change and compare this time difference to timing characteristics of a theoretical thermal behavior model for the 3-D IC device 201 to identify the component of the 3-D IC device to which the fault belongs (e.g., location of the fault in the z-direction).

As illustrated in FIGS. 2-1 and 2-2, upon application of the voltage to the package pins 213 of the 3-D IC device, a hot spot/temperature change 215 is identified at an X-Y location by the IR camera 217. However, that X-Y location may correspond to several different components of the 3-D IC device 201 including the semiconductor die 211, the interposer die 207, the package substrate 203, or solder bumps 209 and solder balls 205 that lie in the z-direction corresponding to the X-Y location. In order to isolate the fault associated with the identified hot spot/temperature change, the component of the 3-D IC device to which the hot spot/temperature change belongs must be identified.

However, as already discussed above, the theoretical thermal behavior model for the 3-D IC device cannot be relied upon for identifying the component to which the fault belongs because of the variability in manufacturing processes and close proximity of components for 3-D IC devices.

Figures 1, 3:
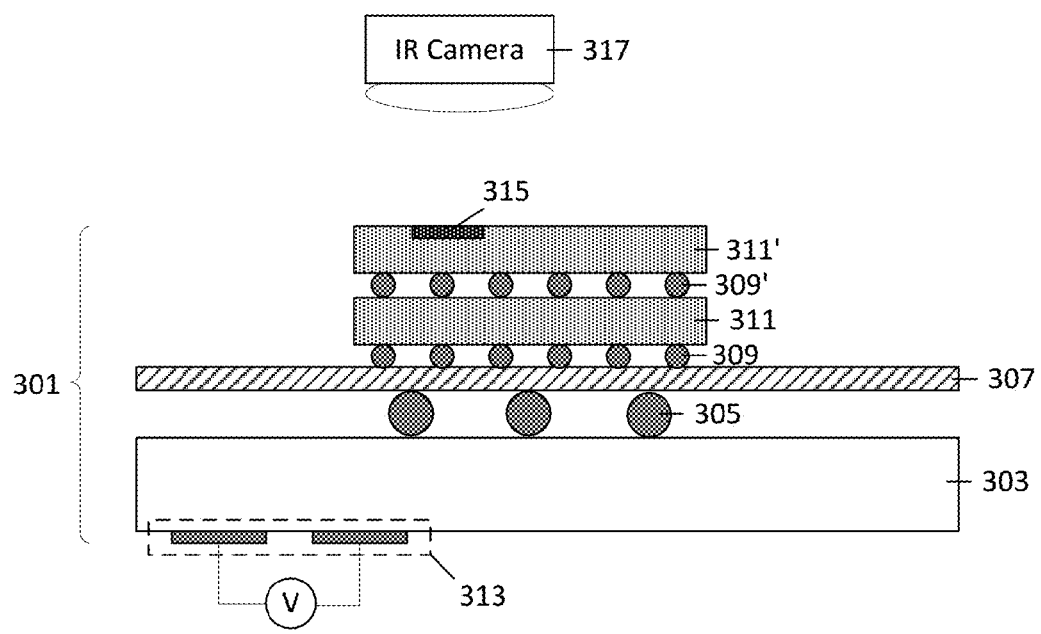
Figures 2, 3:
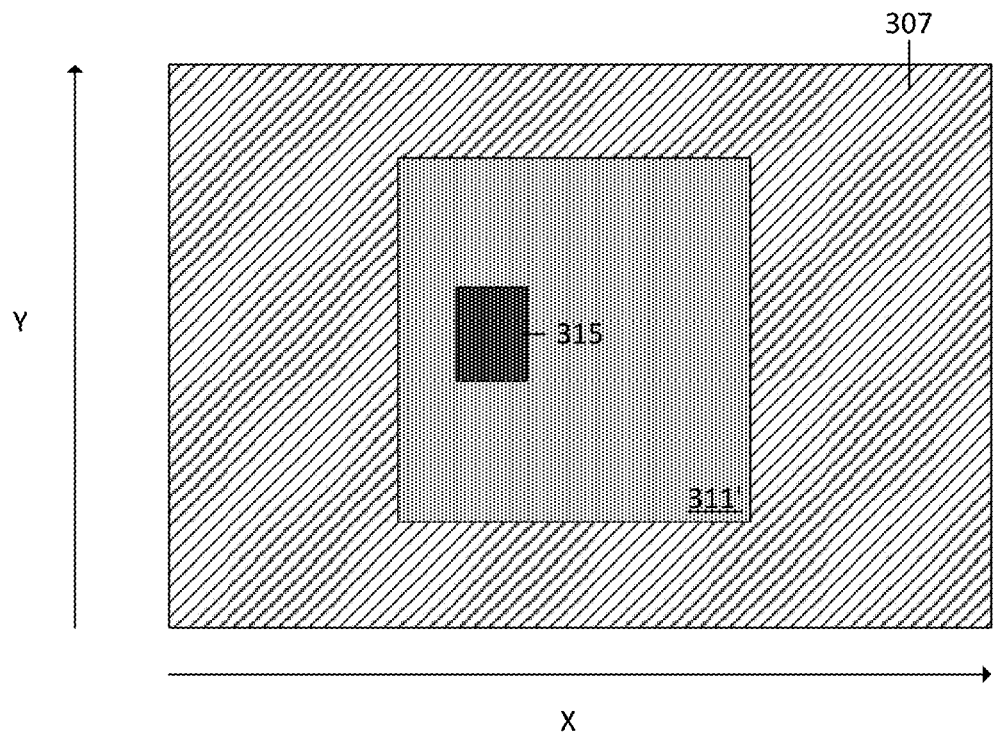

FIGS. 3-1 and 3-2 are a cross-sectional schematic diagram and top-view schematic diagram illustrating application of a three-dimensional thermography fault isolation tool to an alternative 3-D IC device.

The three-dimensional thermography fault isolation tool that is substantially the same as the one described above in FIGS. 2-1 and 2-2. The three-dimensional thermography fault isolation tool includes a voltage source V and an infrared camera 317 configured to identify fault location of a 3-D IC device 301.

The 3-D IC device 301 includes a package substrate 303 with a set of package pins 313, an interposer die 307 and semiconductor dies 311, 311'. Unlike the configuration of semiconductor dies 211, 211' in FIGS. 2-1 and 2-2, the semiconductor dies 311, 311' of the 3-D IC device 301 in FIGS. 3-1 and 3-2 are stacked on top of each other. Semiconductor die 311' is connected to semiconductor die 311 in a vertical configuration using solder bumps 309'. In this configuration, semiconductor die 311' and semiconductor die 311 may directly communicate with each other without going through an interposer die 307.

Semiconductor die 311 may be coupled to the interposer die 307 using a plurality of solder bumps 209. The interposer die 207 includes routing functionality that allows semiconductor dies 311, 311' to communicate with other semiconductor dies (not shown) that may be located in the 3-D IC device. The interposer die 307 may be coupled to the package substrate 303 through a plurality of solder balls 305. The package substrate 303 contains routing functionality for allowing external sources to communicate with the interposer die 307 and the semiconductor dies 311, 311' of the 3-D IC device 301. External communication with the interposer die 307 and the semiconductor dies 311, 311' of the 3-D IC device 301 may be made through the package pins 313 of the package substrate 303.

The voltage source V and the infrared camera 317 may be coupled with a computer system with software for locating faults within the 3-D IC device 301. The infrared camera may capture a temperature change (e.g., hot spot) 315 of a faulty component of the 3-D IC device 301 in the X-Y plane in response to voltage applied by the voltage source V. The software tool may determine the time difference between application of the voltage and occurrence of the temperature change and compare this time difference to timing characteristics of a theoretical thermal behavior model for the 3-D IC device 301 to identify the component to which the fault belongs.

As illustrated in FIGS. 3-1 and 3-2, upon application of the voltage to the package pins 313 of the 3-D IC device 301, a hot spot/temperature change 315 is identified at an X-Y location by the IR camera 317. However, that X-Y location may correspond to several different components of the 3-D IC device 301 including the semiconductor die 311', the semiconductor die 311, the interposer die 307, the package substrate 303, or solder bumps 309, 309' and solder balls 305 that lie in the z-direction corresponding to the X-Y location. In order to isolate the fault associated with the identified hot spot/temperature change, the component to which the hot spot/temperature change belongs must be identified. Because the 3-D IC device 301 of FIGS. 3-1 and 3-2 includes stacked semiconductor dies 311, 311', there are even more components in the z-direction that a hot spot/temperature change 315 identified at an X-Y location may correspond to.

However, as discussed above, the theoretical thermal behavior model for the 3-D IC device cannot be relied upon for identifying the component to which the fault belongs to because of the variability in manufacturing processes and close proximity of components for 3-D IC devices.

What is needed, therefore, is a way to properly calibrate a 3-D thermography fault isolation tool such that it can accurately identify the component to which the fault belongs for a 3-D IC device. Identifying the component to which the fault belongs for a 3-D IC device allows the fault to be accurately isolated, thereby allowing for the fault to be more efficiently corrected.

One way to calibrate the 3-D thermography fault isolation tool is to design a test structure that is manufactured using the same processes as used to manufacture the 3-D IC devices to be tested. By manufacturing the test structure using the same processes as used to manufacturing the 3-D IC devices to be tested, the test structure will have similar variability in device properties as the 3-D IC devices to be tested. Calibrating the thermography fault isolation tool using such a test structure rather than relying solely on a theoretical thermal behavior model based on the various materials, thicknesses, and other parameters designed for the individual layers of components of the 3-D IC devices will help ensure that the component to which the fault belongs will be accurately identified.

Figures 1, 4:
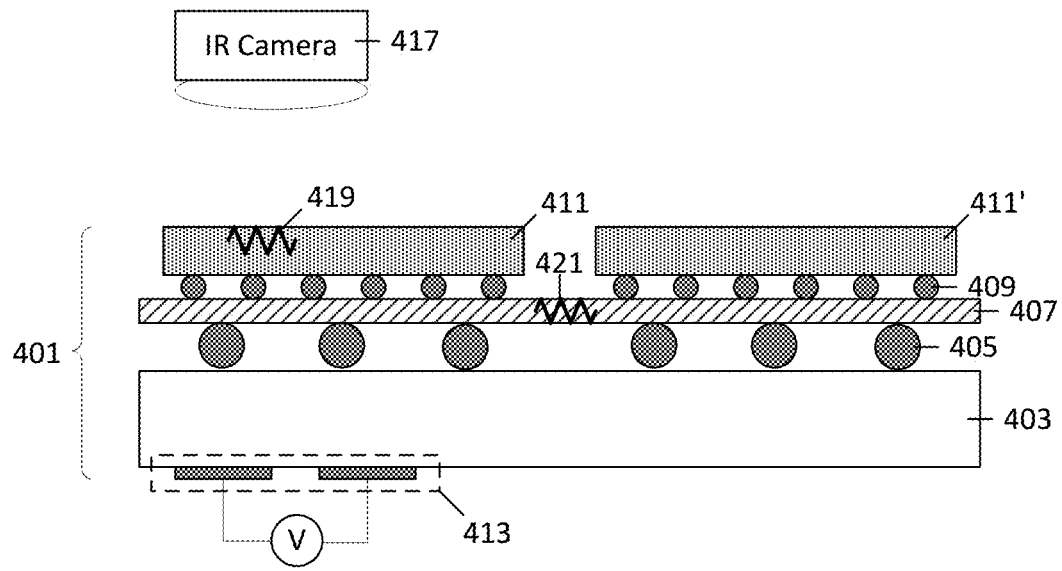
Figures 2, 4:
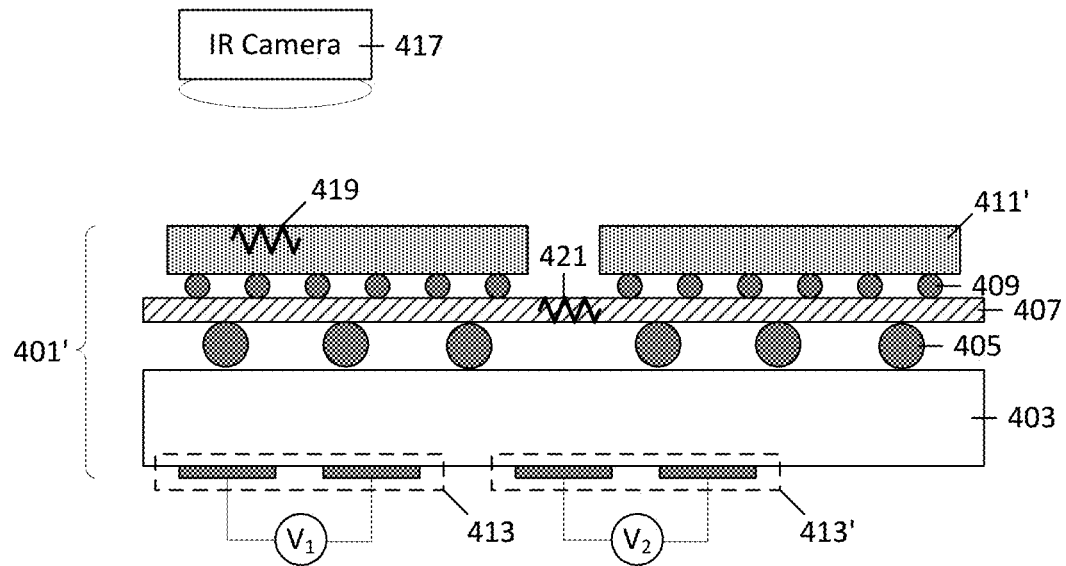

FIG. 4-1 is a cross-sectional schematic diagram of a test structure for calibrating a three-dimensional thermography fault isolation tool. For purposes of example, the test structure illustrated in FIG. 4-1 will be utilized to calibrate a three-dimensional thermography fault isolation tool for identifying the component to which the faults belong for 3-D IC devices such as the one illustrated in FIGS. 2-1 and 2-2.

Much like the 3-D IC device 201 of FIGS. 2-1 and 2-2, the test structure 401 of FIG. 4-1 will include a package substrate 403 with a set of package pins 413, an interposer die 407 and semiconductor dies 411, 411'. The semiconductor dies 411, 411' may lie on the same plane and be coupled to the interposer die 407 using a plurality of solder bumps 409. The interposer die 407 includes routing functionality that allows the semiconductor dies 411, 411' to communicate with each other. The interposer die 407 may be coupled to the package substrate 403 through a plurality of solder balls 405. The package substrate contains routing functionality for allowing external sources to communicate with the interposer die 407 and the semiconductor dies 411, 411' of the test structure 401. External communication with the interposer die 407 and the semiconductor dies 411, 411' of the test structure 401 may be made through the package pins 413 of the package substrate 403.

The test structure 401 will additionally include heat generating test components 419, 421 (e.g., resistors) at different levels in the z-direction. As illustrated in FIG. 4-1, a first heat generating test component 419 is located in semiconductor die 411 and a second heat generating test component 421 is located the interposer die 407. The heat generating test components 419, 421 may be located at different locations in the X-Y plane, so that an IR camera 417 facing the test structure 401 can identify which heat generating test component. While FIG. 4-1 depicts the heat generating test components being located at particular locations in the test structure 401, it is important to note that numerous different locations may be used for the heat generating test components.

The heat generating test components 419, 421 in FIG. 4-1 are resistors. However, various other types of heat generating components may be used for the heat generating test components 419, 421 of the test structure. Additionally, while the test structure of FIG. 4-1 only includes heat generating test components 419, 421 in the semiconductor die 411 and the interposer die 407, in other embodiments, heat generating test components may also be implemented in the package substrate 403 as well as the semiconductor die 411'.

In calibrating the three-dimensional thermography isolation tool, a voltage from a voltage source V is applied to the set of package pins 413 on the package substrate. Although not illustrated in FIG. 4-1, the heat generating test components 419 and 421 are coupled in series so that the voltage applied to the 3-D IC device traverses both heat generating test components 419, 421. When the voltage reaches each heat generating test component 419, 421, the heat generating test component exhibits a temperature change in response to the applied voltage. The IR camera captures this temperature change, and the time difference between occurrence of the temperature change and the application of the voltage is determined.

Heat generating test component 419 will have a first time difference and heat generating test component 421 will have a second time difference. Because the heat generating test components 419 are located at different positions in the z-direction, the first time difference will be different from the second time difference. Heat generating test component 421 will likely have a shorter time difference than heat generating test component 419 because heat generating test component 421 is located closer to the voltage source V.

The three-dimensional thermography fault isolation tool may then be calibrated based on the time differences associated with the heat generating test components 419, 421. The time differences associated with the heat generating test components 419, 421 provide a baseline for how subsequently tested 3-D IC devices will behave. Thus, when the three-dimensional thermography fault isolation tool is subsequently used to identify faults for a 3-D IC device, the time difference measured for temperature change in the 3-D IC device may be compared with the time differences associated with the heat generating test components 419, 421 of the test structure to identify the component to which the fault belongs to for the 3-D IC device.

For example, where a time difference ascertained for temperature change in the 3-D IC device is similar to the first time difference associated with heat generating test component 419, the location of the fault for the 3-D IC device will be located at the same level as a semiconductor die of the 3-D IC device. Likewise, where a time difference ascertained for temperature change in the 3-D IC device is similar to the second time difference associated with heat generating test component 421, the location of the fault for the 3-D IC device will be located in an interposer die of the 3-D IC device. In one implementation, the first and second time differences obtained during the calibration process may be stored in a non-transitory medium in association with the respective Z position of the corresponding heat generating test components. For example, the first time difference associated with the heat generating test component 421 may be 0.3 sec, and the second time difference associated with the heat generating test component 419 may be 0.5 sec. Also, the Z position (e.g., height measured in a direction of a Z-axis) of the component 421 may be 8 mm and the Z position of the component 419 may be 17 mm. These information may be stored in a non-transitory medium. When a 3-D IC device is later tested by the three-dimensional thermography fault isolation tool, the stored information may then be used to identify the position of a component in the 3-D IC device that produces a certain temperature change. For example, during testing of the 3-D IC device, a time difference between a temperature change and an application of a voltage that creates the temperature change may be 0.32 sec. A processing unit may then compared the time difference value 0.32 sec with the stored time difference values 0.3 sec, 0.5 sec. In the illustrated example, the time difference value 0.32 obtained during the testing of the 3-D IC device is closest to the stored time difference value 0.3, which corresponds with the heat generating test component 419 located at 8 mm in height elevation Z (height measured along a Z-axis). Thus, the processing unit may determine that the Z position of the component in the 3-D IC device producing the temperature change is 8 mm. The X and Y positions of the component in the 3-D IC device with respect to the X-Y plane (that is perpendicular to the Z-axis) may be determined using the IR camera 417 viewing into the X-Y plane.

The test structure 401 is manufactured using the same processes as used to manufacture the 3-D IC device 201 of FIGS. 2-1 and 2-2. By manufacturing the test structure 401 in this manner, it is contemplated that the test structure 401 will include similar device variability in 3-D IC device parameters as the 3-D IC devices to be subsequently tested. The similarity in device parameters between the test structure 401 and subsequently tested 3-D IC devices will allow the three-dimensional thermography fault isolation tool to be calibrated for accurately identifying the location of faults in the z-direction for those 3-D IC devices.

FIG. 4-2 is a cross-sectional schematic diagram of another test structure for calibrating a three-dimensional thermography fault isolation tool. The test structure 401' in FIG. 4-2 is configured similarly to the test structure in FIG. 4-1 and as such, will not be described again in extensive detail.

In contrast to the test structure 401 in FIG. 4-1, the heat generating test components 419, 421 in FIG. 4-2 are not coupled in series. Instead, the heat generating test components 419, 421 may be individually controlled. A first voltage from a first voltage source $V_1$ may be applied to a first set of package pins 413 to cause a temperature change in heat generating test component 419 and a second voltage from a second voltage source $V_2$ may be applied to a second set of package pins 413' to cause a temperature change in heat generating test component 421.

The time differences generated by the heat generating test components 419, 421 may then be provided for the three-dimensional thermography fault isolation tool to thereby calibrate the three-dimensional thermography fault isolation tool.

FIGS. 4-1 and 4-2 illustrate two example configurations for a test structure. However, one ordinarily skilled in the art will recognize that the test structure may be configured to allow for any number of heat generating test components to be controlled either independently or dependently.

Figures 1, 5:
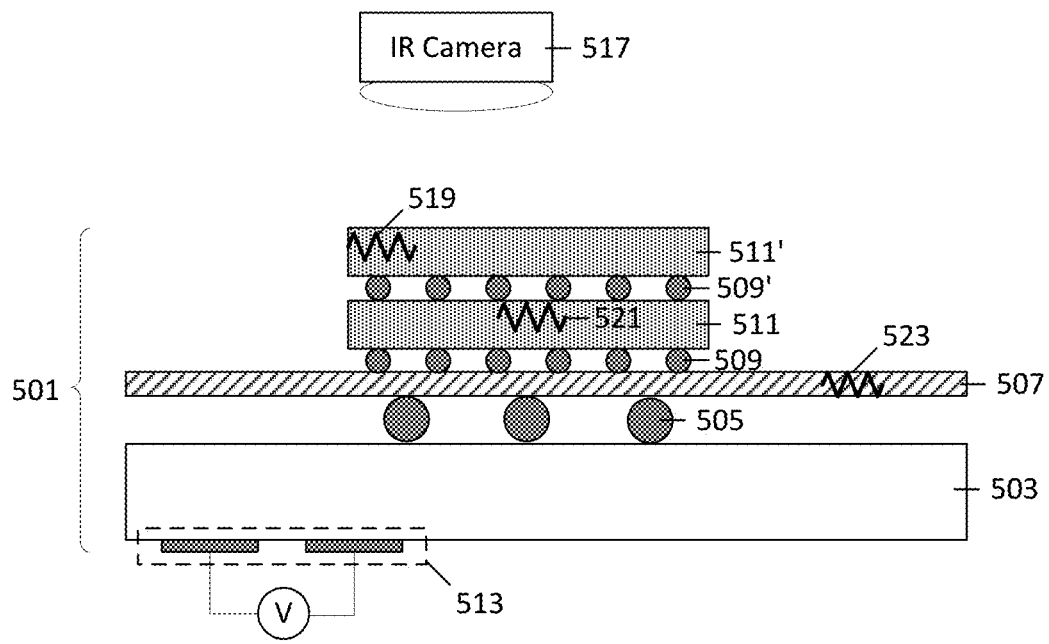
Figures 2, 5:
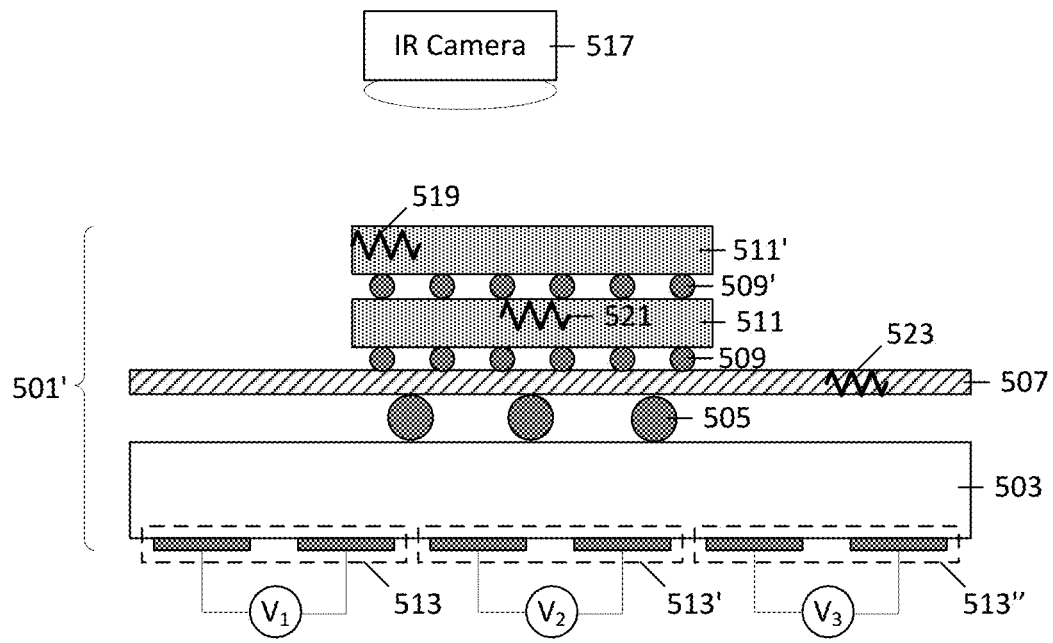
Figures 3, 5:
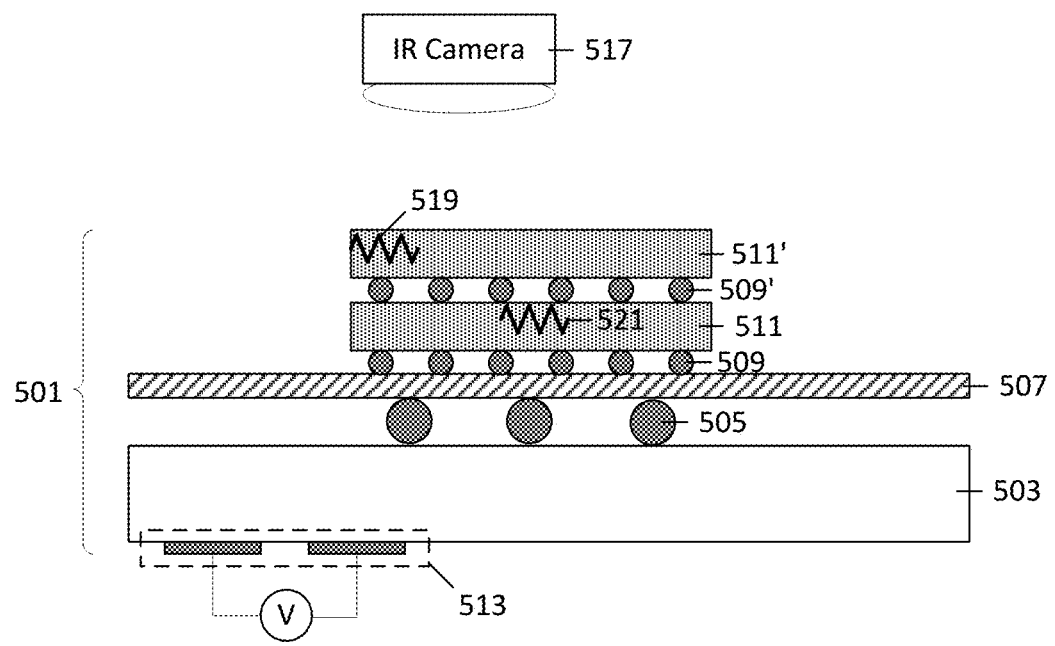
Figures 4, 5:
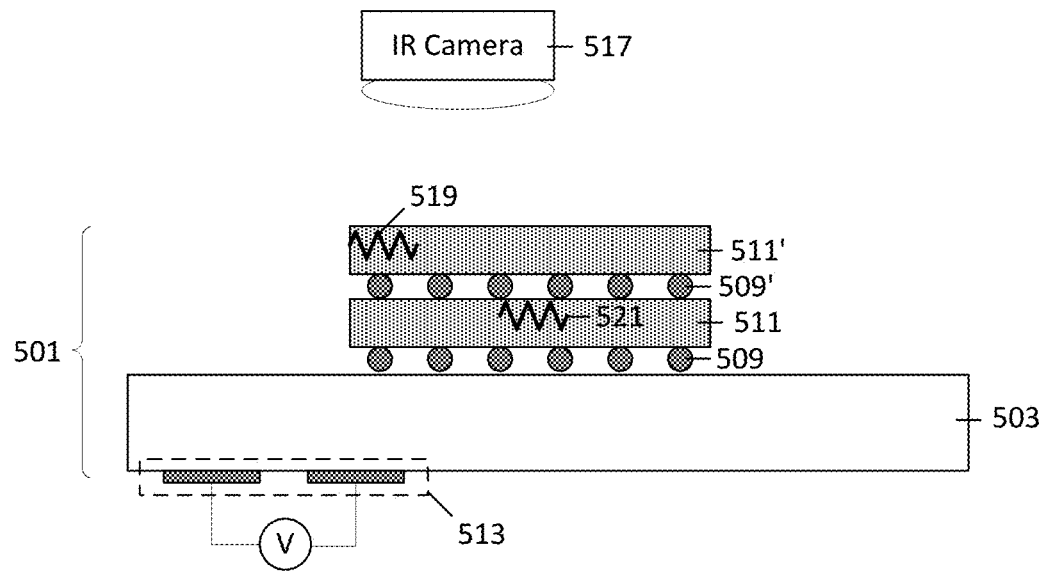

FIG. 5-1 is a cross-sectional schematic diagram of another test structure for calibrating a three-dimensional thermography fault isolation tool. For purposes of example, the test structure illustrated in FIG. 5-1 will be utilized to calibrate a three-dimensional thermography fault isolation tool for identifying the component to which the faults belong for 3-D IC devices such as the one illustrated in FIGS. 3-1 and 3-2.

Much like the 3-D IC device 301 of FIGS. 3-1 and 3-2, the test structure 501 of FIG. 5-1 will include a package substrate 503 with a set of package pins 513, an interposer die 507 and semiconductor dies 511, 511'. The semiconductor dies 511, 511' are stacked on top of each other. Semiconductor die 511' is connected to semiconductor die 511 in a vertical configuration using solder bumps 509'. In this configuration, semiconductor die 511' and semiconductor die 511 may directly communicate with each other without going through an interposer die 507.

Semiconductor die 511 may be coupled to the interposer die 507 using a plurality of solder bumps 509. The interposer die 507 includes routing functionality that allows semiconductor dies 511, 511' to communicate with other semiconductor dies (not shown) that may be located in the 3-D IC device. The interposer die 507 may be coupled to the package substrate 303 through a plurality of solder balls 505. The package substrate 503 contains routing functionality for allowing external sources to communicate with the interposer die 507 and the semiconductor dies 511, 511' of the test structure 501. External communication with the interposer die 507 and the semiconductor dies 511, 511' of the test structure 501 may be made through the package pins 513 of the package substrate 503.

The test structure 501 will additionally include heat generating test components 519, 521 (e.g., resistors) at different levels in the z-direction. As illustrated in FIG. 5-1, a first heat generating test component 519 is located in semiconductor die 511, a second heat generating test component 521 is located in semiconductor die 511', and a third heat generating test component 523 is located in the interposer die 507. Thus, the heat generating test components 519, 521, 523 are located at different heights. The heat generating test components 519, 521, 523 may be located at different locations in the X-Y plane, so that an IR camera 517 facing the test structure 501 can identify which heat generating test component is exhibiting temperature change. While FIG. 5-1 depicts the heat generating test components being located at particular locations in the test structure 501, it is important to note that numerous different locations may be used for the heat generating test components.

The heat generating test components 519, 521, 523 in FIG. 5-1 are resistors. In other embodiments, various other types of heat generating components may be used for the heat generating test components 519, 521 and 523 of the test structure. Additionally, while the test structure of FIG. 5-1 only includes heat generating test components 519, 521, 523 in semiconductor dies 511, 511' and interposer die 507, in other embodiments, heat generating test components may also be implemented in the package substrate 503.

In calibrating the three-dimensional thermography isolation tool, a voltage from a voltage source V is applied to the set of package pins 513 on the package substrate 503. Although not illustrated in FIG. 5-1, the heat generating test components 519, 521, 523 are coupled in series so that the voltage applied to the 3-D IC device traverses all of the heat generating test components 519, 521, 523. When the voltage reaches each heat generating test components 519, 521, 523, the heat generating test component exhibits a temperature change in response to the applied voltage. The IR camera 517 captures this temperature change, and the time difference between occurrence of the temperature change and the application of the voltage is determined.

Heat generating test component 519 will have a first time difference, heat generating test component 521 will have a second time difference, and heat generating test component 523 will have a third time difference. Because the heat generating test components 519, 521, 523 are located at different positions in the z-direction, the first time difference, second time difference, and third time difference will be different from each other. Heat generating test component 523 will likely have a shorter time difference than heat generating test component 521 and heat generating test component 519, because heat generating test component 523 is located closer to the voltage source V. Likewise, heat generating test component 521 will likely have a shorter time difference than heat generating test component 519 because heat generating test component 521 is located closer to the voltage source V.

The three-dimensional thermography fault isolation tool may then be calibrated based on the time differences associated with the heat generating test components 519, 521, 523. The time differences associated with the heat generating test components 519, 521, 523 provide a baseline for how subsequently tested 3-D IC devices will behave. Thus, when the three-dimensional thermography fault isolation tool is subsequently used to identify faults for a 3-D IC device, the time difference measured for temperature change in the 3-D IC device may be compared with the time differences associated with the heat generating test components 519, 521, 523 of the test structure to identify the component to which the faults belong for the 3-D IC device.

For example, where a time difference ascertained for temperature change in the 3-D IC device is similar to the first time difference associated with the heat generating test component 519 in the test structure 501, the location of the fault for the 3-D IC device will be at the same level as the semiconductor die 511' in the test structure 501. Where a time difference ascertained for temperature change in the 3-D IC device is similar to the second time difference associated with heat generating test component 521, the location of the fault for the 3-D IC device will be will be at the same level as the semiconductor die 511' in the test structure 501. Where a time difference ascertained for temperature change in the 3-D IC device is similar to the third time difference associated with heat generating test component 523, the location of the fault for the 3-D IC device will be in an interposer die of the 3-D IC device (i.e., at the same level as that in the test structure 501).

The test structure 501 is manufactured using the same processes as used to manufacture the 3-D IC device 301 of FIGS. 3-1 and 3-2. By manufacturing the test structure 501 in this manner, it is contemplated that the test structure 501 will include similar variability in 3-D IC device parameters as the 3-D IC devices to be subsequently tested. The similarity in 3-D IC device parameters between the test structure 501 and subsequently tested 3-D IC devices will allow the three-dimensional thermography fault isolation tool to be calibrated for accurately identifying the location of faults in the z-direction for those 3-D IC devices.

FIG. 5-2 is a cross-sectional schematic diagram of another test structure 501' for calibrating a three-dimensional thermography fault isolation tool. The test structure 501' in FIG. 5-2 is configured similarly to the test structure in FIG. 5-1 and as such, will not be described again in extensive detail.

In contrast to the test structure 501 in FIG. 5-1, the heat generating test components 519, 521, 523 in FIG. 5-2 are not coupled in series. Instead, the heat generating test components 519, 521, 523 may be individually controlled. A first voltage from a first voltage source $V_1$ may be applied to a first set of package pins 513 to cause a temperature change in heat generating test component 519, a second voltage from a second voltage source $V_2$ may be applied to a second set of package pins 513' to cause a temperature change in heat generating test component 521, and a third voltage from a second voltage source $V_3$ may be applied to a third set of package pins 513" to cause a temperature change in heat generating test component 523.

The time differences generated by the heat generating test components 519, 521, 523 may then be used to calibrate the three-dimensional thermography fault isolation tool in the same manner as described above for FIG. 5-1.

In some embodiments, the interposer die of the test structure may not include any heat generating test component. FIG. 5-3 illustrate the same test structure 501 as that in FIG. 5-1, except that the interposer die 507 does not include the heat generating test component 523. Like that described with reference to FIG. 5-1, the test structure 501 of FIG. 5-3 includes a first heat generating test component 519 located in semiconductor die 511, a second heat generating test component 521 located in semiconductor die 511'. It should be noted that the test structure 501 is not limited to having heat generating test components in semiconductor dies, and that the test structure 501 may have heat generating test components in other locations (i.e., in other parts) of the test structure 501.

Furthermore, in other embodiments, the test structure 501 may not include the interposer die 507. For example, in other embodiments, the semiconductor dies 511, 511' may be coupled to the package substrate 503 using other types of connection. In further embodiments, the semiconductor die 511 may be directly coupled to the package substrate 503 through the solder bumps 509 (see FIG. 5-4).

As an alternative to designing a test structure for calibrating a three-dimensional thermography fault isolation tool, the 3-D IC device to be tested for fault detection may itself be utilized to calibrate the three-dimensional thermography fault isolation tool.

Figure 6:
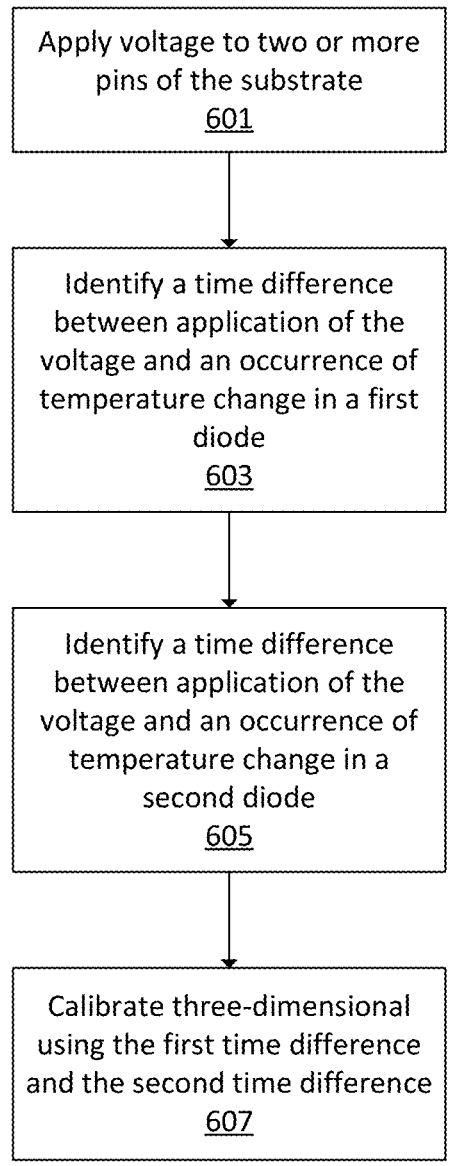
FIG. 6 is a flow diagram illustrating a method for calibrating a three-dimensional thermography fault isolation tool.

FIG. 6 is a flow diagram illustrating a method for calibrating a three-dimensional thermography fault isolation tool. The method of FIG. 6 utilizes the 3-D IC device to be tested for fault detection to calibrate the three-dimensional thermography fault isolation tool.

The 3-D IC device includes at least a package substrate having two or more pins, an interposer die and a first semiconductor die. The interposer die is stacked on top of the package substrate using solder balls and the first semiconductor die is stacked on top of the interposer die using solder bumps. In some embodiments the 3-D IC device may further include additional semiconductor die on the same plane as the first semiconductor die. In some embodiments, the 3-D IC device may further include additional semiconductor die stacked on top of the first semiconductor die. Each of the package substrate, interposer die, first semiconductor die, and any additional semiconductor die stacked on top of the first semiconductor die will be referred to as a component level.

The 3-D IC device will include several diodes at each component level. For example, the interposer die may include diodes and the first semiconductor die may also include diodes. Where the 3-D IC device includes additional semiconductor die stacked on the first semiconductor die, the 3-D IC device will include diodes in each additional semiconductor die.

The diodes at each component level may be functional diodes or dummy diodes. A functional diode refers to a diode that provides an active function during operation of the 3-D IC device. A dummy diode refers to a diode that does not provide any active functionality during operation of the 3-D IC device.

A diode may be selected from each component level for calibrating the three-dimensional thermography fault isolation tool. The selected diodes from the respective component levels may be coupled in series such that their temperature change may be controlled by a single voltage source, or may be uncoupled such that their temperature changes are independently controlled by different voltage sources. Additionally, the selected diodes may lie at different positions in an X-Y plane to allow for an IR camera positioned facing the 3-D IC device to identify which diodes exhibit temperature changes.

For purposes of example, the method in FIG. 6 will be described with reference to a 3-D IC device having a package substrate, interposer die, a first semiconductor die and optionally additional die on the same plane as the first semiconductor die. However, it is important to note that the method may be extended to calibrate a three-dimensional thermography fault isolation tool with a 3-D IC device having any number of component levels.

The 3-D IC device to be used for performing calibration will include a first selected diode in the interposer die and a second selected diode in the first semiconductor die.

In calibrating the three-dimensional thermography fault isolation tool, a voltage is first applied to the two or more pins of the package substrate as shown at 601. Where the diodes selected at each component level are coupled in series, the voltage is applied to two pins in the package substrate, causing all of the diodes to exhibit temperature changes. Where the diodes selected at each component level are uncoupled, a different voltage may be applied to a different package pin set for each selected diode in the 3-D IC device.

For example, a first voltage may be applied to a first set of package pins that correspond to the first diode in the interposer, and a second voltage may be applied to a second set of package pins that correspond to the second diode in the first semiconductor die.

A first time difference between application of the voltage and an occurrence of the temperature change in the first diode is determined as shown at 603. An IR camera positioned facing the 3-D IC device may be used to identify the time at which the temperature change in the first diode occurs. This time is compared against the time at which the voltage is applied to the 3-D IC device to determine the first time difference. The first time difference represents the amount of time it takes for the applied voltage to traverse the 3-D IC device to reach the first diode in the interposer die to cause it to change temperatures.

A second time difference between application of the voltage and an occurrence of the temperature change in the second diode is then determined as shown at 605. An IR camera positioned facing the 3-D IC device may be used to identify the time at which the temperature change in the second diode occurs. This time is compared against the time at which the voltage is applied to the 3-D IC device to determine the second time difference. The second time difference represents the amount of time it takes for the applied voltage to traverse the 3-D IC device to reach the second diode in the first semiconductor die to cause it to change temperatures.

The three-dimensional thermography fault isolation tool is then calibrated using the first time difference and the second time difference as shown at 607. By utilizing the first time difference and the second time difference, the three-dimensional thermography fault isolation tool is able to generate a baseline for thermal behavior of the 3-D IC device. When the 3-D IC device is later tested for faults using the three-dimensional thermography fault isolation tool, the time difference associated with temperature change for a faulty component of the 3-D IC device may be compared to the time differences used for calibration to determine the component to which the fault belongs to (e.g., the location of the fault in the z-direction).

Because the three-dimensional thermography fault isolation tool is calibrated using the actual 3-D IC device to be tested rather than a theoretical thermal behavior model, the ability of the three-dimensional fault isolation tool to identify the location of the fault and its corresponding 3-D IC device component may be made to be much more accurate. Furthermore, allowing the three-dimensional thermography fault isolation tool to be calibrated using the 3-D IC device to be tested requires minimal cost and processing.

As mentioned above, the method for calibrating a three-dimensional thermography fault isolation tool may be extended to any 3-D IC device. For example, where the 3-D IC device includes an additional semiconductor die stacked on top of the first semiconductor die, a third diode in the additional semiconductor die may be selected. A voltage may then be applied to the 3-D IC device to cause a temperature change in the third diode, and a third time difference between application of the voltage and the occurrence of the temperature change in the additional semiconductor die may be determined and provided for calibrating the three-dimensional thermography fault isolation tool.

Figures 1, 7:
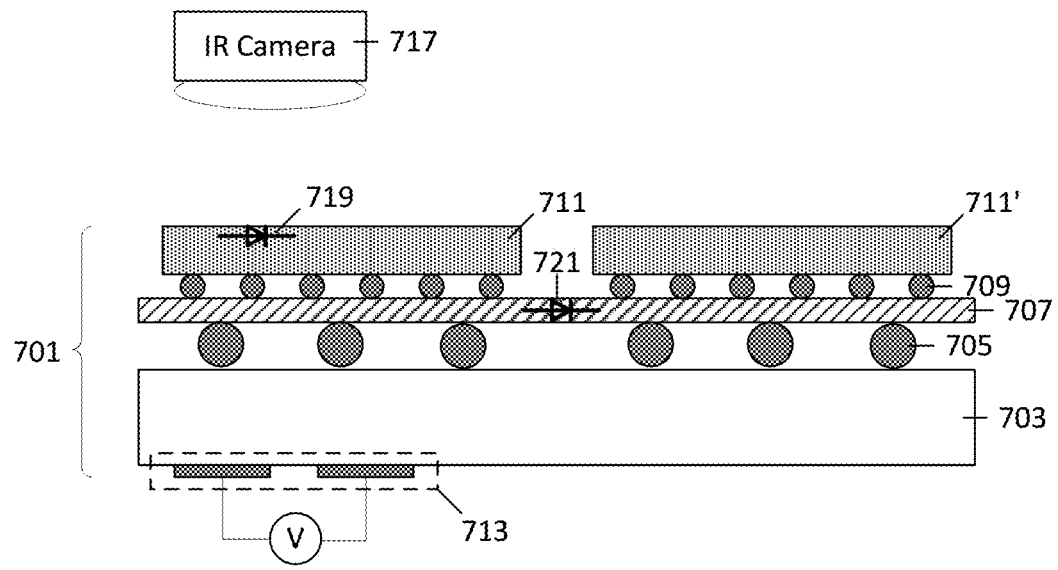
Figures 2, 7:
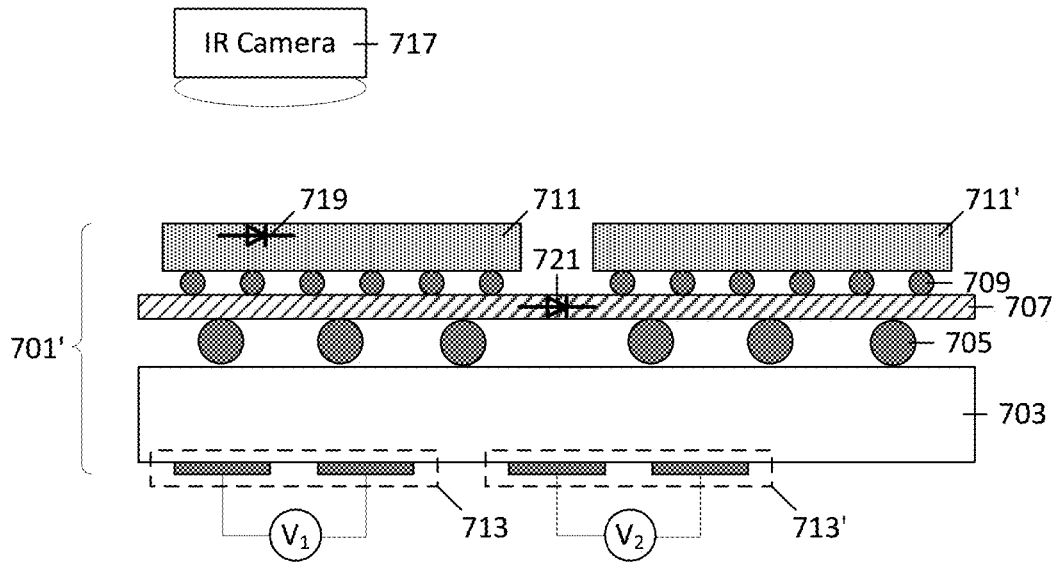

FIGS. 7-1 and 7-2 are cross-sectional schematic diagrams illustrating three-dimensional thermography fault isolation tools.

FIG. 7-1 illustrates a three-dimensional thermography fault isolation tool being calibrated using a 3-D IC device 701 that is similar to the 3-D IC device illustrated in FIGS. 2-1 and 2-2. The three-dimensional thermography fault isolation tool includes a voltage source V and a IR camera 717 configured to identify fault location of a 3-D IC device.

The 3-D IC device 701 includes a package substrate 703 with a set of package pins 713, an interposer die 707 and semiconductor dies 711, 711'. The semiconductor dies 711, 711' may be coupled to the interposer die 707 using a plurality of solder bumps 709. The interposer die 707 includes routing functionality that allows the semiconductor dies 711, 711' to communicate with each other. The interposer die 707 may be coupled to the package substrate 703 through a plurality of solder balls 705. The package substrate contains routing functionality for allowing external sources to communicate with the interposer die 707 and the semiconductor dies 711, 711' of the 3-D IC device 201. External communication with the interposer die 707 and the semiconductor dies 711, 711' of the 3-D IC device 701 may be made through the package pins 713 of the package substrate 703.

The 3-D IC device 701 includes several diodes at each component level. For example, the interposer die 707 may include diodes and the semiconductor dies 711, 711' may also include diodes. A diode is selected from each component level for calibrating the three-dimensional thermography fault isolation tool. In FIG. 7-1, a first diode 721 is selected from the interposer die 707 and a second diode 719 is selected from semiconductor die 711. The selected diodes 719, 721 may be functional diodes or dummy diodes. As mentioned above, a functional diode refers to a diode that provides an active function during operation of the 3-D IC device, and a dummy diode refers to a diode that does not provide any active functionality during operation of the 3-D IC device.

Although not depicted in FIG. 7-1, the first diode 721 and the second diode 719 are coupled in series such that their temperature change may be controlled by a single voltage source V. The selected diodes 719, 721 are at different respective component levels (e.g., height measured in a direction of a Z-axis). Additionally, the selected diodes 719, 721 lie at different positions in an X-Y plane (that is perpendicular to the Z-axis) to allow for an IR camera 717 positioned facing the 3-D IC device 701 to identify which diodes exhibit temperature changes.

In calibrating the three-dimensional thermography fault isolation tool, a voltage from a voltage source V is first applied to the set of two pins 713 of the package substrate 703. In some embodiments, the application of the voltage results in forward biasing the first diode 721 and the second diode 719 to thereby cause corresponding temperature changes in the first and second diodes 721, 719.

A first time difference between application of the voltage and an occurrence of the temperature change in the first diode 721 is determined. The IR camera 717 positioned facing the 3-D IC device 701 is used to identify the time at which the temperature change in the first diode 721 occurs. This time is compared against the time at which the voltage is applied to the 3-D IC device 701 to determine the first time difference. The first time difference represents the amount of time it takes for the applied voltage to traverse the 3-D IC device 701 to reach the first diode 721 in the interposer die 707 to cause it to change temperatures.

A second time difference between application of the voltage and an occurrence of the temperature change in the second diode 719 is then determined. Again, the IR camera 717 is used to identify the time at which the temperature change in the second diode 719 occurs. This time is compared against the time at which the voltage is applied to the 3-D IC device 701 to determine the second time difference. The second time difference represents the amount of time it takes for the applied voltage to traverse the 3-D IC device 701 to reach the second diode 719 in the semiconductor die 711 to cause it to change temperatures.

The three-dimensional thermography fault isolation tool is then calibrated using the first time difference and the second time difference. By utilizing the first time difference and the second time difference, the three-dimensional thermography fault isolation tool is able to generate a baseline for thermal behavior of the 3-D IC device 701. When the 3-D IC device 701 is later tested for faults using the calibrated three-dimensional thermography fault isolation tool, the time difference associated with temperature change for a faulty component of the 3-D IC device 701 may be compared to the time differences used for calibration to determine the component to which the fault belongs to (e.g., the location of the fault in the z-direction).

FIG. 7-2 illustrates another three-dimensional thermography fault isolation tool being calibrated using a 3-D IC device 701' that is similar to the 3-D IC device illustrated in FIGS. 2-1 and 2-2. The 3-D IC device 701' in FIG. 7-2 is similar to the 3-D IC device 701 in FIG. 7-1 and as such, will not be described again in extensive detail.

In contrast to the method for calibration described in FIG. 7-1, the method for calibration in FIG. 7-2 involves selecting a first diode 721 in the interposer die 707 and a second diode 719 in semiconductor die 711 that are not coupled in series. Instead, the first diode 721 and the second diode 719 may be individually controlled. A first voltage from a first voltage source $V_1$ may be applied to a first set of package pins 713 to cause a temperature change in the first diode 721, and a second voltage from a second voltage source $V_2$ may be applied to a second set of package pins 713' to cause a temperature change in the first diode 721.

The time differences generated by the first diode 719 and the second diode 721 may then be used to calibrate the three-dimensional thermography fault isolation tool in the same manner as described above for FIG. 7-1.

Figures 1, 8:
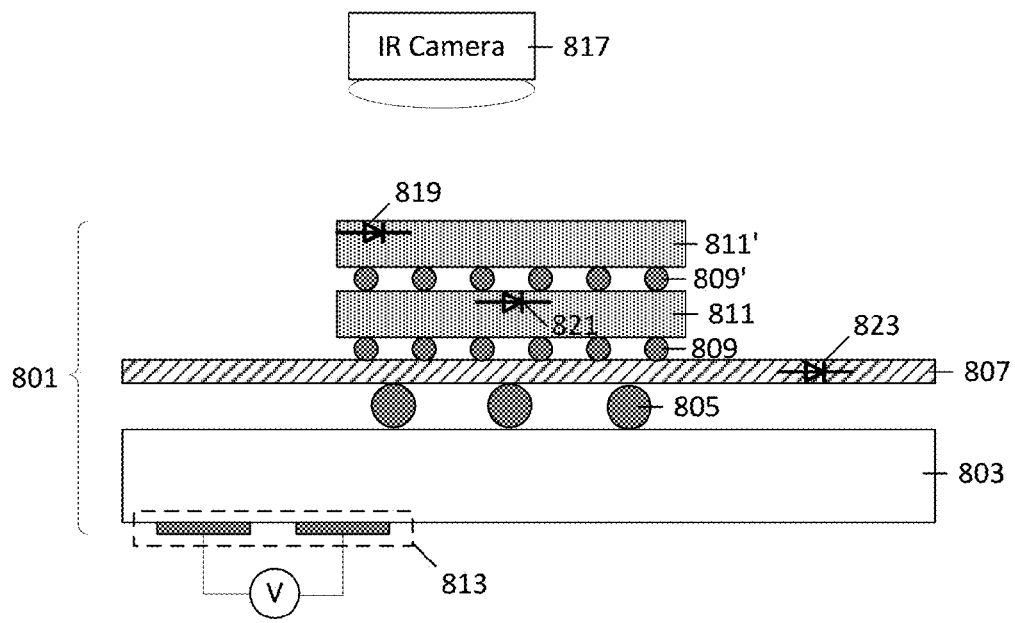
Figures 2, 8:
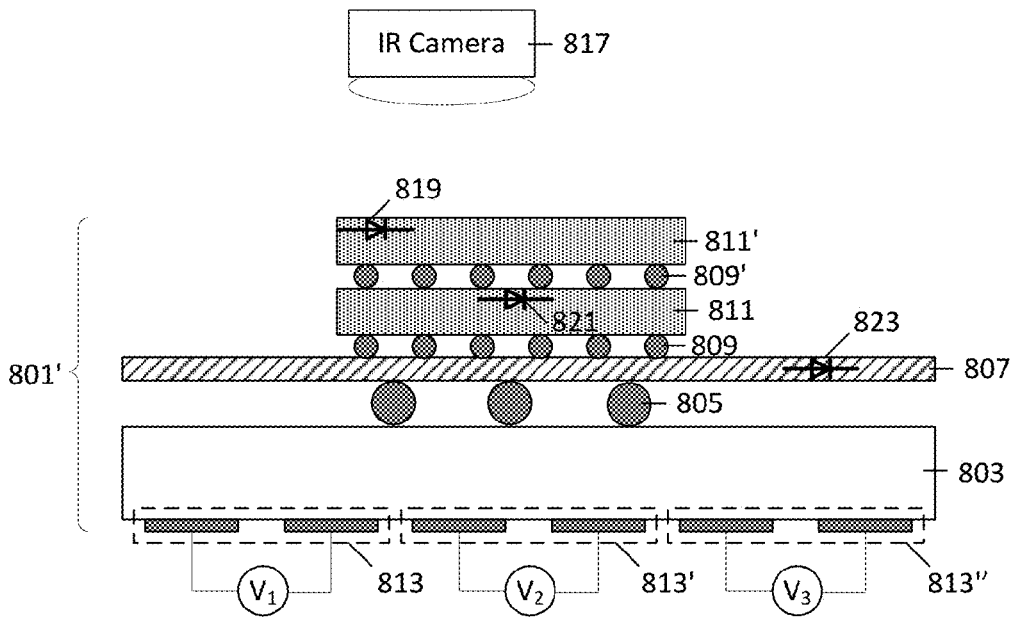
Figures 3, 8:
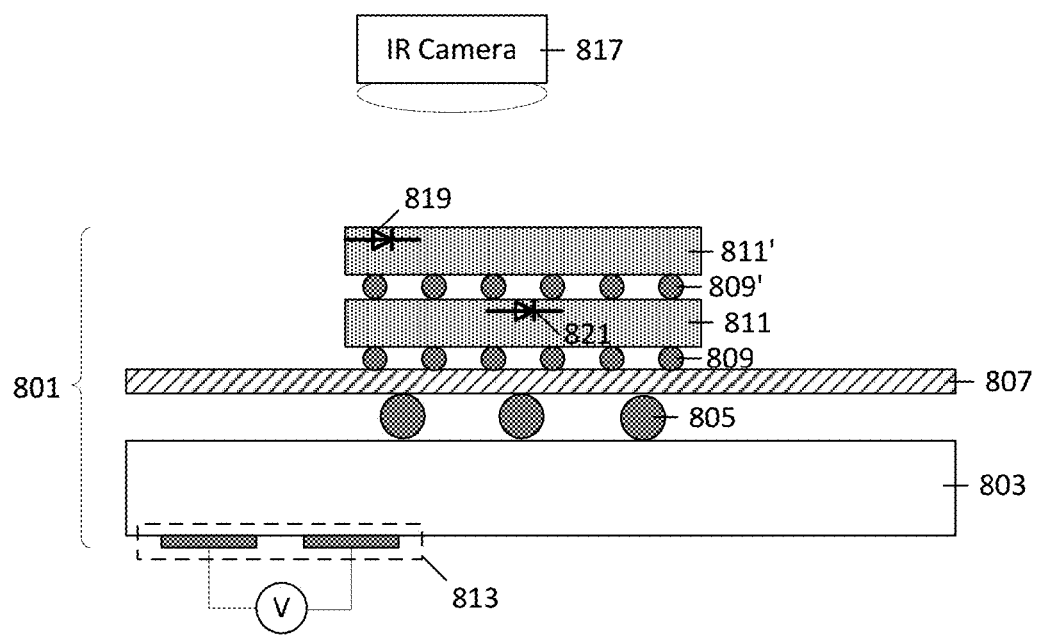
Figures 4, 8:
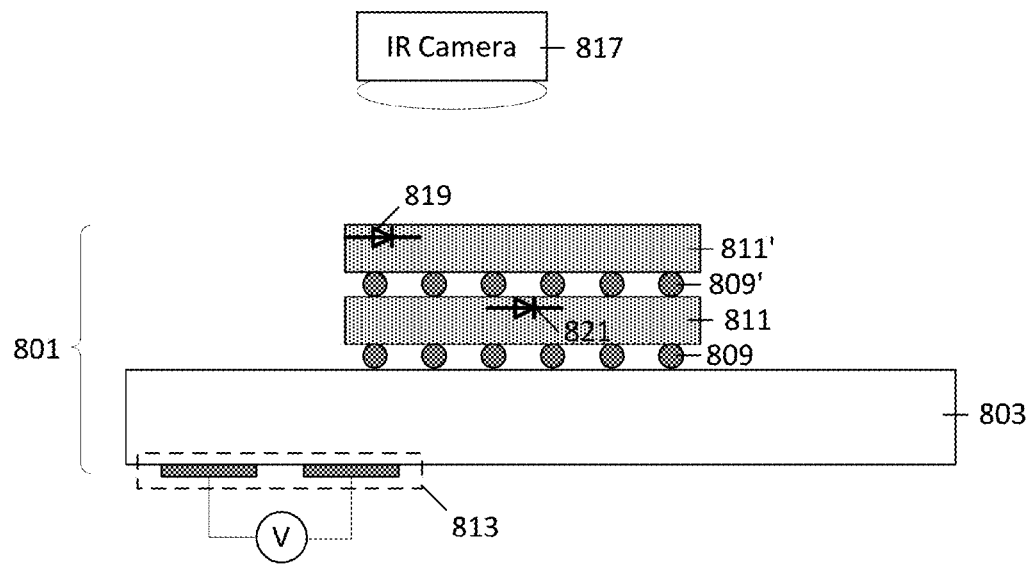

FIGS. 8-1 and 8-2 are cross-sectional schematic diagrams illustrating three-dimensional thermography fault isolation tools.

FIG. 8-1 illustrates a three-dimensional thermography fault isolation tool being calibrated using a 3-D IC device 801 that is similar to the 3-D IC device illustrated in FIGS. 3-1 and 3-2.

The 3-D IC device 801 includes a package substrate 803 with a set of package pins 813, an interposer die 807 and semiconductor dies 811, 811'. The semiconductor dies 811, 811' of the 3-D IC device 801 in FIGS. 8-1 and 8-2 are stacked on top of each other. Semiconductor die 811' is connected to semiconductor die 811 in a vertical configuration using solder bumps 809'. In this configuration, semiconductor die 811' and semiconductor die 811 may directly communicate with each other without going through an interposer die 807

Semiconductor die 811 may be coupled to the interposer die 807 using a plurality of solder bumps 809. The interposer die 807 includes routing functionality that allows semiconductor dies 811, 811' to communicate with other semiconductor dies (not shown) that may be located in the 3-D IC device. The interposer die 807 may be coupled to the package substrate 803 through a plurality of solder balls 805. The package substrate 803 contains routing functionality for allowing external sources to communicate with the interposer die 807 and the semiconductor dies 811, 811' of the 3-D IC device 801. External communication with the interposer die 807 and the semiconductor dies 811, 811' of the 3-D IC device 801 may be made through the package pins 813 of the package substrate 803.

The 3-D IC device will include several diodes at each component level. For example, the interposer die 807 may include diodes and the semiconductor dies 811, 811' may also include diodes. A diode is selected from each component level for calibrating the three-dimensional thermography fault isolation tool. In FIG. 8-1, a first diode 823 is selected from the interposer die 807, a second diode 821 is selected from semiconductor die 811 and a third diode 819 is selected from semiconductor die 811'. The selected diodes 819, 821, 823 may be functional diodes or dummy diodes. As mentioned above, a functional diode refers to a diode that provides an active function during operation of the 3-D IC device and a dummy diode refers to a diode that does not provide any active functionality during operation of the 3-D IC device.

Although not depicted in FIG. 8-1, the first diode 823, the second diode 821 and the third diode 819 are coupled in series such that their temperature change may be controlled by a single voltage source V. The diodes 823, 821, 819 are located at different respective heights. Additionally, the selected diodes 819, 821, 823 lie at different positions in an X-Y plane to allow for an IR camera 817 positioned facing the 3-D IC device 801 to identify which diodes exhibit temperature changes.

In calibrating the three-dimensional thermography fault isolation tool, a voltage from a voltage source V is first applied to the set of two pins 813 of the package substrate 803.

A first time difference between application of the voltage and an occurrence of the temperature change in the first diode 823 is determined. The IR camera 817 positioned facing the 3-D IC device 801 is used to identify the time at which the temperature change in the first diode 823 occurs. This time is compared against the time at which the voltage is applied to the 3-D IC device 801 to determine the first time difference. The first time difference represents the amount of time it takes for the applied voltage to traverse the 3-D IC device 801 to reach the first diode 823 in the interposer die 807 to cause it to change temperatures.

A second time difference between application of the voltage and an occurrence of the temperature change in the second diode 821 is then determined. Again, the IR camera 817 is used to identify the time at which the temperature change in the second diode 821 occurs. This time is compared against the time at which the voltage is applied to the 3-D IC device 801 to determine the second time difference. The second time difference represents the amount of time it takes for the applied voltage to traverse the 3-D IC device 801 to reach the second diode 821 in the semiconductor die 811 to cause it to change temperatures.

A third time difference between application of the voltage and an occurrence of the temperature change in the third diode 819 is then determined. Again, the IR camera 817 is used to identify the time at which the temperature change in the third diode 819 occurs. This time is compared against the time at which the voltage is applied to the 3-D IC device 801 to determine the third time difference. The third time difference represents the amount of time it takes for the applied voltage to traverse the 3-D IC device 801 to reach the third diode 819 in the semiconductor die 811' to cause it to change temperatures.

The three-dimensional thermography fault isolation tool is then calibrated using the first time difference, the second time difference, and the third time difference. By utilizing the first time difference, the second time difference and the third time difference, the three-dimensional thermography fault isolation tool is able to generate a baseline for thermal behavior of the 3-D IC device 801. When the 3-D IC device 801 is later tested for faults using the calibrated three-dimensional thermography fault isolation tool, the time difference associated with temperature change for a faulty component of the 3-D IC device 801 may be compared to the time differences used for calibration to determine the component to which the fault belongs to (e.g., the location of the fault in the z-direction).

FIG. 8-2 illustrates another three-dimensional thermography fault isolation tool being calibrated using a 3-D IC device 801' similar to the 3-D IC device illustrated in FIGS. 3-1 and 3-2. The 3-D IC device 801' in FIG. 8-2 is similar to the that described in FIG. 8-1 and as such, will not be described again in extensive detail.

In contrast to the method for calibration described in FIG. 8-1, the method for calibration in FIG. 8-2 involves selecting a first diode 823 in the interposer die 807, a second diode 821 in semiconductor die 811, and a third diode 819 in semiconductor die 811' that are not coupled in series. Instead, the first diode 823, the second diode 821 and the third diode 823 may be individually controlled. A first voltage from a first voltage source $V_1$ may be applied to a first set of package pins 813 to cause a temperature change in the first diode 823, a second voltage from a second voltage source $V_2$ may be applied to a second set of package pins 813' to cause a temperature change in the second diode 821 and a third voltage from a third voltage source $V_3$ may be applied to a third set of package pins 813" to cause a temperature change in the third diode 819.

The time differences generated by the first diode 823, the second diode 821 and the third diode 819 may then be provided to the three-dimensional thermography fault isolation tool to thereby calibrate the three-dimensional thermography fault isolation tool.

In some embodiments, the interposer die of the 3-D IC device may not include any diode. FIG. 8-3 illustrate the same 3-D IC device 801 as that in FIG. 8-1, except that the interposer die 807 does not include the diode 823. Like that described with reference to FIG. 8-1, the 3-D IC device 801 of FIG. 8-3 includes a diode 821 located in semiconductor die 811, a diode 819 located in semiconductor die 811'. It should be noted that the 3-D IC device 801 is not limited to having diodes in semiconductor dies, and that the 3-D IC device 801 may have diodes in other locations (i.e., in other parts) of the 3-D IC device 801.

Furthermore, in other embodiments, the 3-D IC device 801 may not include the interposer die 807. For example, in other embodiments, the semiconductor dies 811, 811' may be coupled to the package substrate 803 using other types of connection. In further embodiments, the semiconductor die 811 may be directly coupled to the package substrate 803 through the solder bumps 809 (see FIG. 8-4).

Because the three-dimensional thermography fault isolation tool is calibrated using the actual 3-D IC device to be tested rather than a theoretical thermal behavior model, the ability of the three-dimensional fault isolation tool to identify the location of the fault and its corresponding 3-D IC device component may be made to be much more accurate. Furthermore, allowing the three-dimensional thermography fault isolation tool to be calibrated using the 3-D IC device to be tested requires minimal cost and processing.

In one or more embodiments (e.g., the embodiments of FIG. 4, 5, 7, or 8) described herein, the calibration of the three-dimensional thermography fault isolation tool may further involves storing the time differences in a non-transitory medium, so that the stored time differences may be later retrieved for comparison with time differences obtained during testing of the 3-D IC device. In such cases, the three-dimensional thermography fault isolation tool may further include the non-transitory medium.

Also, in some embodiments, the three-dimensional thermography fault isolation tool may further include a processing module (e.g., one or more processor, which may be implemented using hardware, software, or combination thereof) configured to determine time differences during calibration of the three-dimensional thermography fault isolation tool, determine one or more time differences during testing of the 3-D IC device, and compare the time differences obtained during the testing of the 3-D IC device with the time differences obtained during the calibration process to thereby determine a fault position (e.g., in X, Y, and Z coordinates) in the 3-D IC device.

Although particular features have been shown and described, it will be understood that they are not intended to limit the claimed invention, and it will be made obvious to those skilled in the art that various changes and modifications may be made without departing from the spirit and scope of the claimed invention. The specification and drawing are, accordingly, to be regarded in an illustrative rather than restrictive sense. The claimed invention is intended to cover all alternatives, modifications and equivalents.

What is claimed is:

1. An apparatus for calibrating a three-dimensional thermography fault isolation tool, comprising:
a substrate having two or more pins;
a first semiconductor die coupled to the substrate;
a first heat generating test component at the first semiconductor die; and
a second heat generating test component, wherein the first heat generating test component and the second heat generating test component are located at different respective heights;
wherein the first heat generating test component is configured to produce a first temperature change in response to a first voltage applied by the three-dimensional thermography fault isolation tool to the two or more pins;
wherein the second heat generating test component is configured to produce a second temperature change in response to the first voltage or a second voltage applied by the three-dimensional thermography fault isolation tool; and
wherein a first time difference exists between the application of the first voltage and an occurrence of the first temperature change in the first heat generating test component, and a second time difference exists between the application of the first voltage or the second voltage and an occurrence of the second temperature change in the second heat generating test component; and
wherein the apparatus further comprises a processing unit for processing the first time difference and the second time difference to obtain a result for calibrating the three-dimensional thermography fault isolation tool.

2. The apparatus of claim 1, wherein the first time difference is different from the second time difference.

3. The apparatus of claim 1, wherein the first heat generating test component and the second heat generating test component are coupled in series.

4. The apparatus of claim 1, wherein the two or more pins comprise a first two pins and a second two pins, and wherein a first voltage applied to the first two pins of the substrate causes the first temperature change in the first heat generating test component, and a second voltage applied to the second two pins of the substrate causes the second temperature change in the second heat generating test component.

5. The apparatus of claim 1, wherein the different respective heights for the first heat generating test component and the second heat generating test component are measured along a Z-axis, and the first and second heat generating test components are in different locations with respect to an X-Y plane that is perpendicular to the Z-axis.

6. The apparatus of claim 1, further comprising a second semiconductor die stacked above the first semiconductor die, wherein the second heat generating test component is at the second semiconductor die.

7. The apparatus of claim 1, further comprising an interposer die configured to couple the first semiconductor die to the substrate, wherein the second heat generating test component is at the interposer die.

8. The apparatus of claim 1, further comprising a third heat generating test component, wherein the first, second, and third heat generating test components are located at different respective heights.

9. The apparatus of claim 1, wherein the first heat generating test component comprises a resistor.

10. The apparatus of claim 1, wherein the first heat generating test component comprises a diode.

11. The apparatus of claim 1, wherein the substrate and the first semiconductor die are parts of a test structure that is different from an integrated circuit device to be tested by the three-dimensional thermography fault isolation tool.

12. The apparatus of claim 1, wherein the substrate and the first semiconductor die are parts of an integrated circuit device to be tested by the three-dimensional thermography fault isolation tool.

13. A method involving a three-dimensional thermography fault isolation tool, comprising:
  providing an apparatus comprising a substrate having two or more pins, a first semiconductor die coupled to the substrate, a first heat generating test component, and a second heat generating test component, wherein the first heat generating test component and the second heat generating test component are located at different respective heights;
    applying one or more voltages, using the three-dimensional thermography fault isolation tool, to the two or more pins of the substrate to cause a first temperature change in the first heat generating test component, and a second temperature change in the second heat generating test component;
  determining a first time difference between the application of the one or more voltages and an occurrence of the first temperature change in the first heat generating test component;
  determining a second time difference between the application of the one or more voltages and an occurrence of the second temperature change in the second heat generating test component; and
  processing the first time difference and the second time difference by a processing unit to obtain a result for calibrating the three dimensional thermography fault isolation tool.

14. The method of claim 13, wherein the first and second heat generating test components comprise first and second diodes.

15. The method of claim 14, wherein the first and second diodes are dummy diodes.

16. The method of claim 14, wherein the apparatus comprises a semiconductor device, and the first diode and the second diode are functional diodes in the semiconductor device.

17. The method of claim 13, further comprising storing the first time difference and the second time difference in a non-transitory medium.

18. The method of claim 13, wherein the first heat generating test component and the second heat generating test component are coupled in series, and the act of applying one or more voltages comprises applying one voltage.

19. The method of claim 13, wherein the apparatus further comprises a second semiconductor die stacked above the first semiconductor die, and wherein the second heat generating test component is at the second semiconductor die.

20. The method of claim 13, wherein the apparatus is different from an integrated circuit device to be tested by the three-dimensional thermography fault isolation tool, and wherein the method further comprises:
  testing the integrated circuit device to produce a temperature change at a component in the integrated circuit device;
  determining a time difference between the application of the voltage and the corresponding temperature change at the component in the integrated circuit device; and
  comparing the time difference with at least one of the first time difference and the second time difference to determine a position of the component.

21. The method of claim 13, wherein the apparatus is an integrated circuit device, and wherein the method further comprises:
  testing the integrated circuit device to produce a temperature change at a component in the integrated circuit device;
  determining a time difference between the application of the voltage and the corresponding temperature change at the component in the integrated circuit device; and
  comparing the time difference with at least one of the first time difference and the second time difference to determine a position of the component.

* * * * *